(12) United States Patent
Motwani

(10) Patent No.: US 10,879,938 B2
(45) Date of Patent: Dec. 29, 2020

(54) ERASURE CODING TO MITIGATE MEDIA DEFECTS FOR DISTRIBUTED DIE ECC

(71) Applicant: Intel Corporation, Santa Clara, CA (US)

(72) Inventor: Ravi Motwani, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 16/173,293

(22) Filed: Oct. 29, 2018

(65) Prior Publication Data

US 2019/0074851 A1    Mar. 7, 2019

(51) Int. Cl.
| | |
|---|---|
| *H03M 13/29* | (2006.01) |
| *H03M 13/15* | (2006.01) |
| *G06F 11/10* | (2006.01) |
| *H03M 13/37* | (2006.01) |
| *G11C 29/52* | (2006.01) |
| *H03M 13/11* | (2006.01) |

(52) U.S. Cl.
CPC ..... *H03M 13/2906* (2013.01); *G06F 11/1068* (2013.01); *G06F 11/1076* (2013.01); *H03M 13/154* (2013.01); *H03M 13/3761* (2013.01); *G11C 29/52* (2013.01); *H03M 13/1102* (2013.01)

(58) Field of Classification Search
CPC ................................................. H03M 13/2906
USPC ........................................ 714/755, 752, 757
See application file for complete search history.

(56) References Cited

U.S. PATENT DOCUMENTS

| | | | |
|---|---|---|---|
| 9,432,298 B1* | 8/2016 | Smith | H04L 49/9057 |
| 9,530,513 B1* | 12/2016 | Pan | G11C 16/32 |
| 10,552,058 B1* | 2/2020 | Jadon | G06F 3/0679 |

* cited by examiner

*Primary Examiner* — Fritz Alphonse
(74) *Attorney, Agent, or Firm* — Jordan IP Law, LLC

(57) ABSTRACT

An embodiment of a semiconductor apparatus may include technology to store a first portion of a code for a tile in a first die of the two or more nonvolatile memory die, store a second portion of the code for the tile in a second die of the two or more nonvolatile memory die, and perform an exclusive-or operation to correct a data error in the tile based on the stored first and second portions of the code. Other embodiments are disclosed and claimed.

20 Claims, 9 Drawing Sheets

ERASURE CODING TO MITIGATE MEDIA DEFECTS FOR DISTRIBUTED DIE ECC

TECHNICAL FIELD

Embodiments generally relate to memory and storage systems. More particularly, embodiments relate to erasure coding to mitigate media defects for distributed die error correction code (ECC)

BACKGROUND

A persistent storage device, such as a solid state drive (SSD), may include media such as NAND memory. Memory and storage devices generally include error correction technology. Some devices may utilize ECCs to correct data errors.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile memory (NVM). Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

NVM may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

Figure 1:
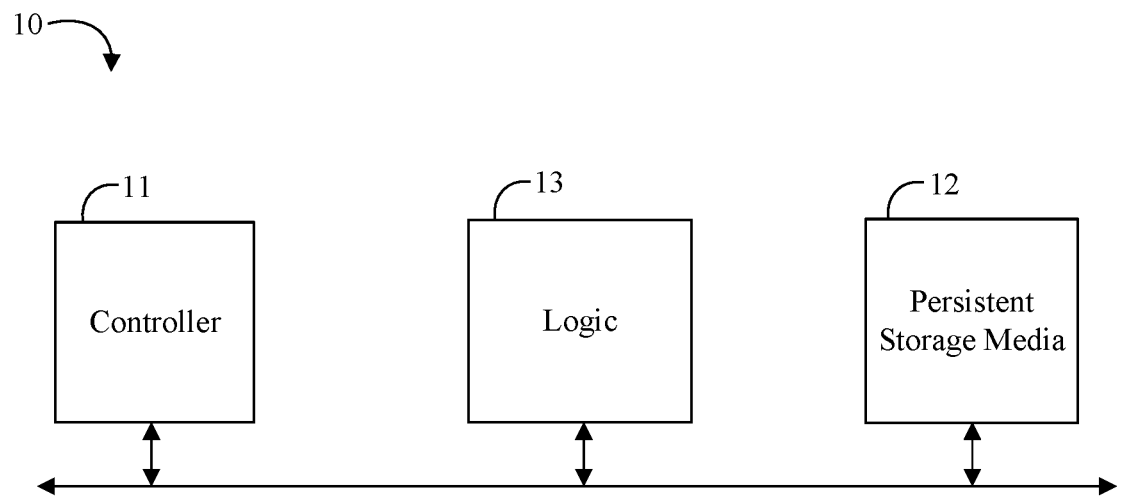
FIG. 1 is a block diagram of an example of an electronic storage system according to an embodiment.

Turning now to FIG. 1, an embodiment of an electronic storage system 10 may include persistent storage media 12 including two or more nonvolatile memory die with each die organized into two or more tiles, a controller 11 communicatively coupled to the persistent storage media 12, and logic 13 communicatively coupled to the controller 11 to store a first portion of a code for a tile in a first die of the two or more nonvolatile memory die, store a second portion of the code for the tile in a second die of the two or more nonvolatile memory die, and perform an exclusive-or (XOR) operation to correct a data error in the tile based on the stored first and second portions of the code. In some embodiments, the logic 13 may be configured to distribute first and second portions of multiple codes corresponding to multiple tiles of the first and second die such that the XOR operation may be performed to successfully reconstruct the data for a failed tile. For example, the logic 13 may be further configured to determine if the tile has failed, and perform the XOR operation to reconstruct the data for the tile based on only one of the first portion and the second portion of the code corresponding to the tile. In some embodiments, the logic 13 may be configured to store first portions of odd numbered codes and second portions of even numbered codes in the first die, and store second portions of odd numbered codes and first portions of even numbered codes in the second die (e.g., as described in more detail below). In some embodiments, a first bit width of the XOR operation may be wider than a second bit width of the code, and the logic 13 may be configured to perform the XOR operation to correct a data error in the two or more tiles based on two or mode codes, and distribute groups of the two or more codes corresponding to multiple tiles of the first and second die such that the XOR operation may be performed to successfully reconstruct the data for a failed tile.

In any of the embodiments herein, the persistent storage media 12 may include a SSD. In some embodiments, the logic 13 may be located in, or co-located with, various components, including the controller 11 (e.g., on a same die).

Embodiments of each of the above controller 11, persistent storage media 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a storage controller, a memory controller, a micro-controller, a general purpose processor, a special purpose processor, a central processor unit (CPU), etc.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C # or the like and conventional procedural programming languages, such as the "C" programming language or similar programming languages. For example, the persistent storage media 12, or other system memory may store a set of instructions which when executed by the controller 11 cause the system 10 to implement one or more components, features, or aspects of the system 10 (e.g., the logic 13, storing the first portion of the code for the tile in the first die, storing the second portion of the code for the tile in the second die, performing the XOR operation to correct the data error in the tile based on the stored first and second portions of the code, etc.).

Figure 2:
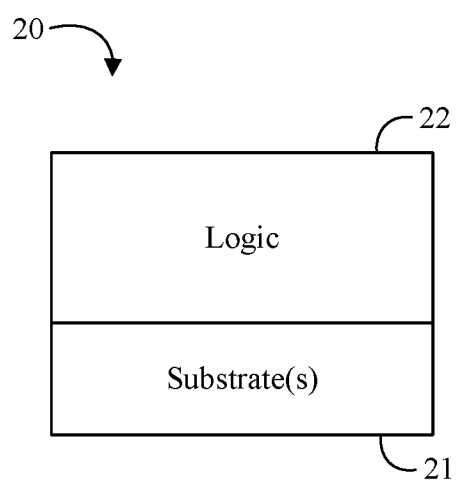
FIG. 2 is a block diagram of an example of a semiconductor apparatus according to an embodiment.

Turning now to FIG. 2, an embodiment of a semiconductor apparatus 20 (e.g., for use with two or more nonvolatile memory die with each die organized into two or more tiles) may include one or more substrates 21, and logic 22 coupled to the one or more substrates 21, wherein the logic 22 is at least partly implemented in one or more of configurable logic and fixed-functionality hardware logic. The logic 22 coupled to the one or more substrates 21 may be configured to store a first portion of a code for a tile in a first die of the two or more nonvolatile memory die, store a second portion of the code for the tile in a second die of the two or more nonvolatile memory die, and perform an XOR operation to correct a data error in the tile based on the stored first and second portions of the code. In some embodiments, the logic 22 may be configured to distribute first and second portions of multiple codes corresponding to multiple tiles of the first and second die such that the XOR operation may be performed to successfully reconstruct the data for a failed tile. For example, the logic 22 may be further configured to determine if the tile has failed, and perform the XOR operation to reconstruct the data for the tile based on only one of the first portion and the second portion of the code corresponding to the tile. In some embodiments, the logic 22 may be configured to store first portions of odd numbered codes and second portions of even numbered codes in the first die, and store second portions of odd numbered codes and first portions of even numbered codes in the second die (e.g., as described in more detail below). In some embodiments, a first bit width of the XOR operation may be wider than a second bit width of the code, and the logic 22 may be configured to perform the XOR operation to correct a data error in the two or more tiles based on two or mode codes, and distribute groups of the two or more codes corresponding to multiple tiles of the first and second die such that the XOR operation may be performed to successfully reconstruct the data for a failed tile. In any of the embodiments herein, the two or more nonvolatile memory die may comprise a SSD. In some embodiments, the logic 22 coupled to the one or more substrates 21 may include transistor channel regions that are positioned within the one or more substrates 21.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

The apparatus 20 may implement one or more aspects of the method 25 (FIGS. 3A to 3C), or any of the embodiments discussed herein. In some embodiments, the illustrated apparatus 20 may include the one or more substrates 21 (e.g., silicon, sapphire, gallium arsenide) and the logic 22 (e.g., transistor array and other integrated circuit/IC components) coupled to the substrate(s) 21. The logic 22 may be implemented at least partly in configurable logic or fixed-functionality logic hardware. In one example, the logic 22 may include transistor channel regions that are positioned (e.g., embedded) within the substrate(s) 21. Thus, the interface between the logic 22 and the substrate(s) 21 may not be an abrupt junction. The logic 22 may also be considered to include an epitaxial layer that is grown on an initial wafer of the substrate(s) 21.

Figure 3A:
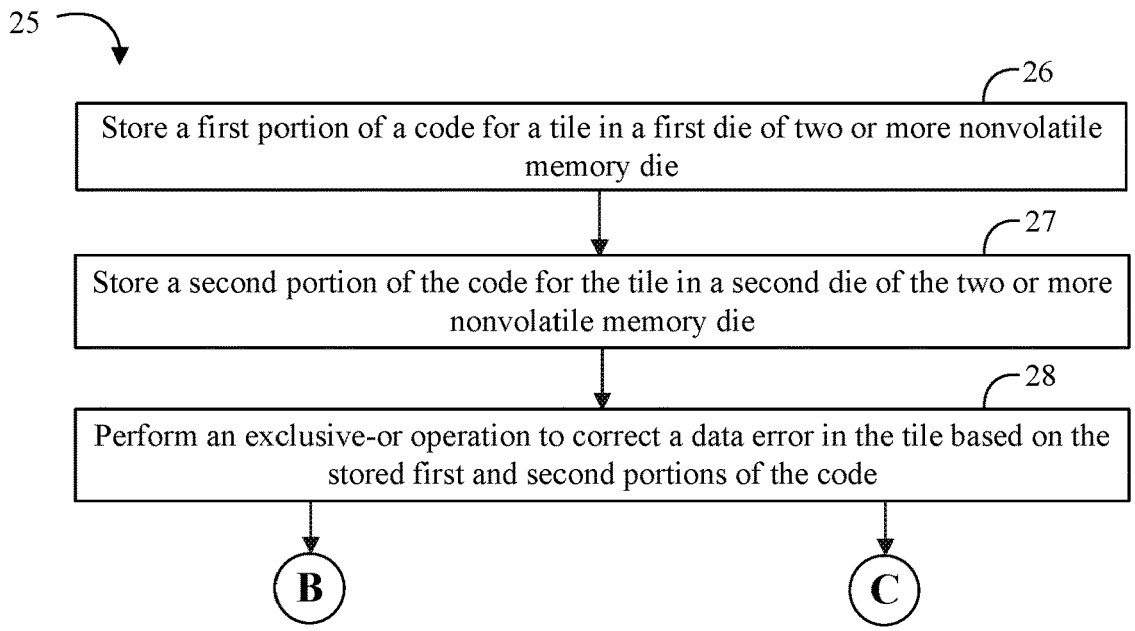
FIGS. 3A to 3C are flowcharts of an example of a method of controlling memory according to an embodiment.
Figure 3B:
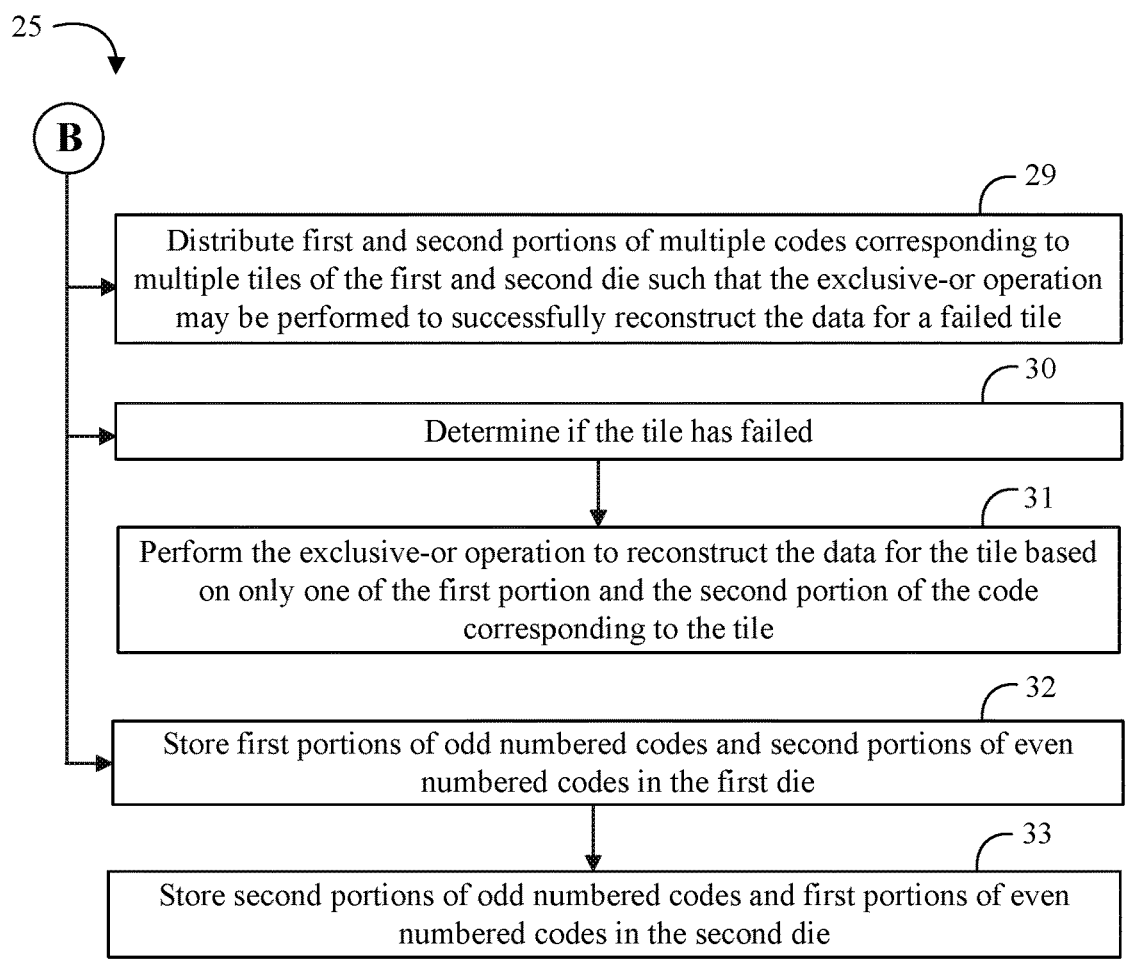
Figure 3C:
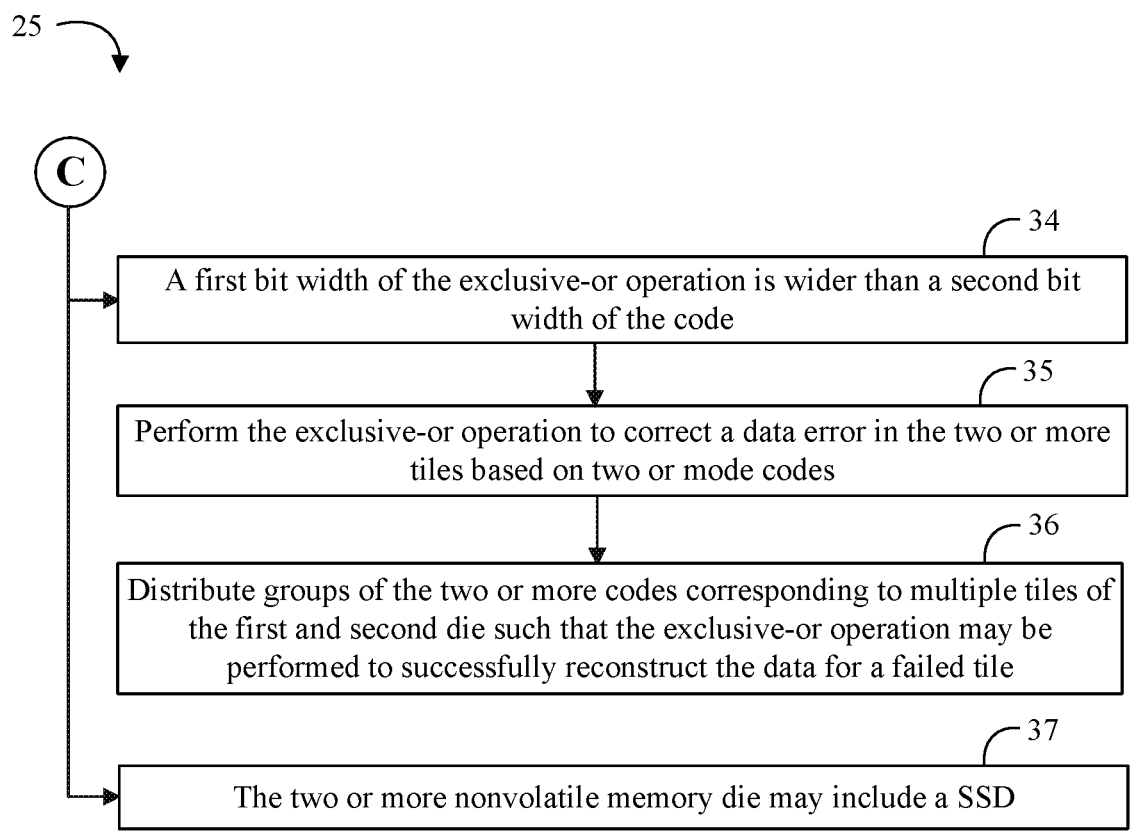

Turning now to FIGS. 3A to 3C, an embodiment of a method 25 of controlling memory may include storing a first portion of a code for a tile in a first die of two or more nonvolatile memory die at block 26, storing a second portion of the code for the tile in a second die of the two or more nonvolatile memory die at block 27, and performing an XOR operation to correct a data error in the tile based on the stored first and second portions of the code at block 28. Some embodiments of the method 25 may include distributing first and second portions of multiple codes corresponding to multiple tiles of the first and second die such that the XOR operation may be performed to successfully reconstruct the data for a failed tile at block 29. For example, the method 25 may also include determining if the tile has failed at block 30, and performing the XOR operation to reconstruct the data for the tile based on only one of the first portion and the second portion of the code corresponding to the tile at block 31. Some embodiments of the method 25 may further include storing first portions of odd numbered codes and second portions of even numbered codes in the first die at block 32, and storing second portions of odd numbered codes and first portions of even numbered codes in the second die at block 33. In some embodiments of the method 25, a first bit width of the XOR operation is wider than a second bit width of the code at block 34, and the method 25 may further include performing the XOR operation to correct a data error in the two or more tiles based on two or mode codes at block 35, and distributing groups of the two or more codes corresponding to multiple tiles of the first and second die such that the XOR operation may be performed to successfully reconstruct the data for a failed tile at block 36. For example, the two or more nonvolatile memory die may include a SSD at block 37.

Embodiments of the method 25 may be implemented in a system, apparatus, computer, device, etc., for example, such as those described herein. More particularly, hardware implementations of the method 25 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 25 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C # or the like and conventional procedural programming languages, such as the "C" programming language or similar programming languages.

For example, the method 25 may be implemented on a computer readable medium as described in connection with Examples 21 to 27 below. Embodiments or portions of the method 25 may be implemented in firmware, applications (e.g., through an application programming interface (API)), or driver software running on an operating system (OS). Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Some embodiments may advantageously provide inter-tile group (ITG)-XOR compatible die distributed codeword technology for NAND flash-based SSDs. For example, ITG-XOR, planar XOR and other XOR techniques may be utilized for NAND SSDs to mitigate tile fails, plane fails, and die fails. In some other systems, an ECC codeword which is stored across two die may not work with XOR techniques. Some embodiments may advantageously provide technology to store data such that each of these XOR schemes continue to work.

Media defects can occur in the form of tile fails, pairs of tile fails, plane fails or die fails. Preferably, the provided XOR overhead is less than or equal to the potential media defect to be corrected, otherwise excessive capacity may be lost due to overdesigned XOR overhead. To correct for a tile fail, for example, the ECC codeword size may be equal to the tile size.

Figure 4:
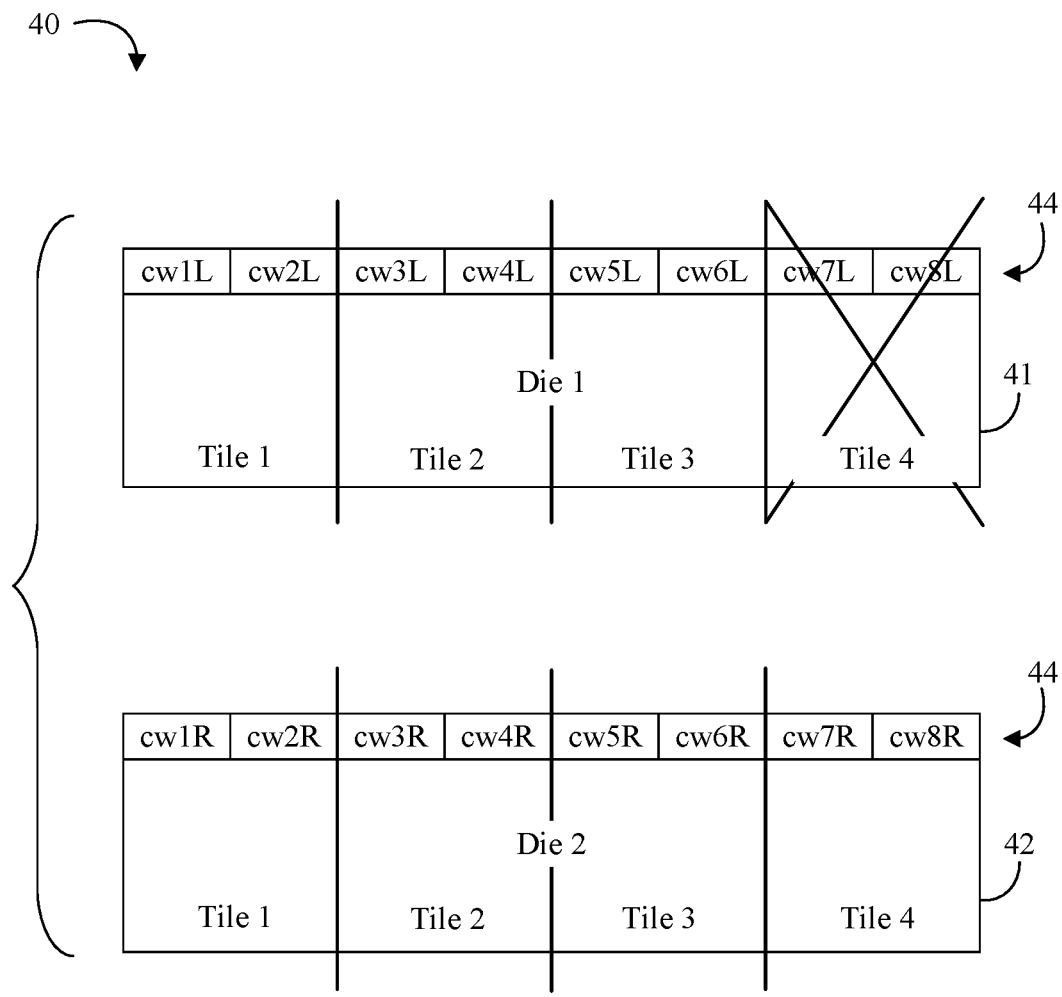
FIG. 4 is an illustrative diagram of an example of a memory system according to an embodiment.

Turning now to FIG. 4, an embodiment of a memory system 40 may include multiple die including a first die 41 and a second die 42. Each of the die may include multiple tiles (e.g., Tile 1 . . . Tile 4). For some NAND-based SSDs, the payload may be protected by a low-density parity check (LDPC) code. Some ECC technology may store the LDPC code in a single die, which may lead to high concurrency and may simplify many operations including the XOR operation. However, to mitigate higher raw bit error rates (RBERs), a distributed die codeword may be more effective. For example, a single LDPC codeword may be split and stored in two or more dies. Splitting the codeword may reduce concurrency, but other technology such as independent multi-plane parallel read operations (IMPRO) may increase the concurrency for a quad plane NAND.

As shown in FIG. 4, eight (8) codewords 44 (e.g., cw1 . . . cw8) may each be divided into left and right portions (cw1L, cw2L . . . cw8L, cw8R). The codewords are XORed with each other, so the XOR operation provides a valid codeword. For normal XOR data correction operation, the XOR equation may be represented as follows:

$$X_1(i)+X_2(i)+X_3(i)+\ldots X_N(i)=0 \qquad [\text{Eq. 1}]$$

where i corresponds to a bit index, $X_n(i)$ corresponds to the i-th bit of the n-th codeword, and N corresponds to the number of codewords for the XOR operation.

Distributed die codeword schemes may break the XOR operation because a tile/plane/die fail may cause multiple ECC codeword chunks to get lost. As shown in FIG. 4, for example, if Tile 4 of Die 1 fails, cw7L and cw8L may both be lost. To perform error recovery for the failed tile, the XOR equation for the left portion of the codeword(s) may be represented as follows:

$$\text{cw}1L(1)+\text{cw}2L(1)+\text{cw}3L(1)+\ldots+\text{cw}7L(1)+\text{cw}8L(1)=0 \qquad [\text{Eq. 2}]$$

where the bit width of the XOR operation is the same as the bit width of the codeword. Because both cw7L(1) and cw8L(1) are unknown, the equation cannot be solved. Accordingly, in the event of a tile fail for Tile 4, the XOR operation will not be able to recover the lost die contents because the XOR equation involves erased bits from cw7L and cw8L. For a distributed codeword scheme where a ECC codeword is distributed equally across two dies, if the left portion of 8 codewords is in one die and if the right portions are in another die, a tile fail would imply that the left portion of two codewords (e.g., cw7L and cw8L) are both lost. Because the XOR codeword is the XOR of all the codewords including 7 and 8, the XOR equations for the left bits will involve two unknowns and cannot be solved. Hence ITG-XOR will fail to reconstruct the lost tile bits. However, instead of the left portions of two codewords being stored in one tile, some embodiments may store the left portion of a codeword and a right portion of another codeword in each tile, such that ITG-XOR may recover from tile fails. The XOR equation for the left bits will involve only one unknown and the XOR equation for the right bit will also involve only one unknown.

Figure 5:
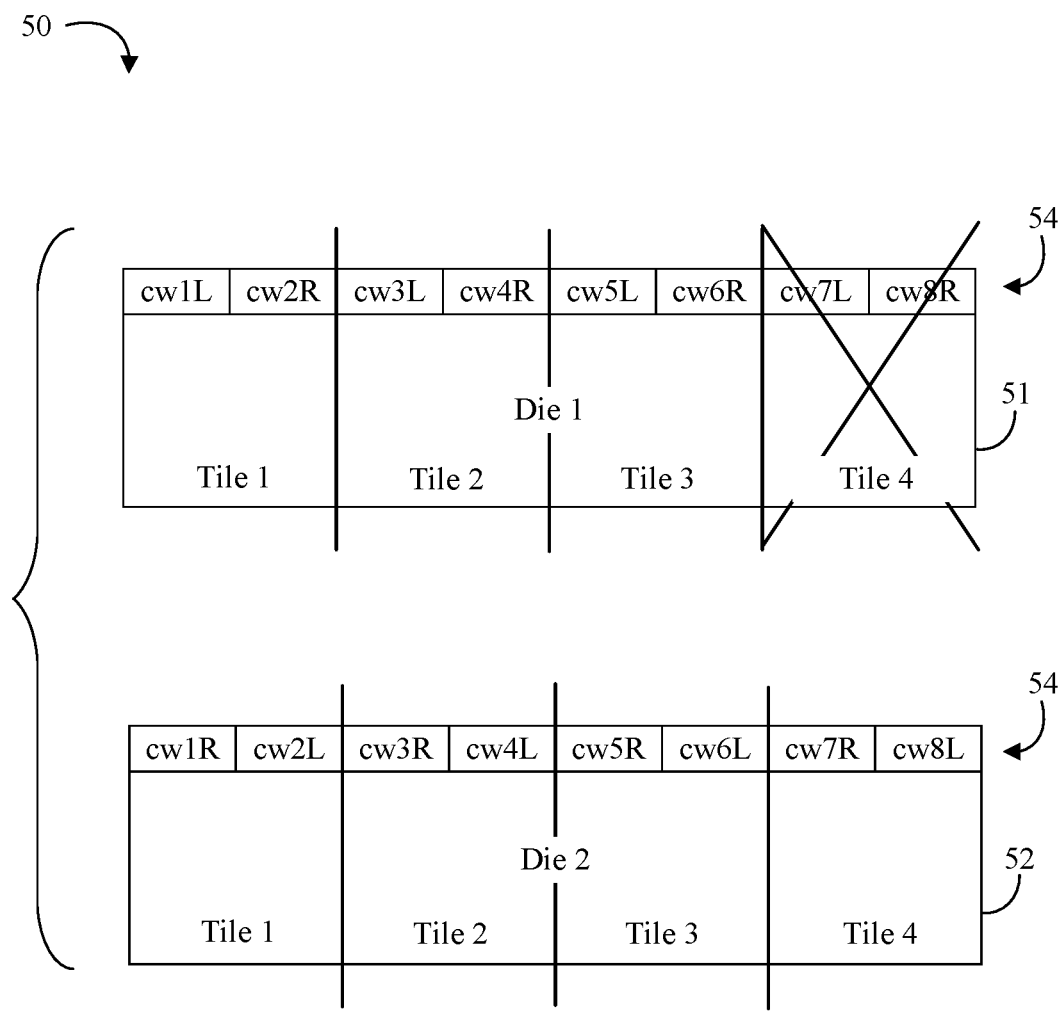
FIG. 5 is an illustrative diagram of another example of a memory system according to an embodiment.

Turning now to FIG. 5, an embodiment of a memory system 50 may include multiple die including a first die 51 and a second die 52. Each of the die may include multiple tiles (e.g., Tile 1 . . . Tile 4). Each tile may have an associated LDPC codeword, resulting in eight (8) codewords 54 (e.g., cw1 . . . cw8) distributed among the first die 51 and the second die 42. For example, the codewords may each be divided into left and right portions (cw1L, cw2L . . . cw8L, cw8R). Advantageously, some embodiments may interleave the codeword portions such that ITG-XOR techniques may continue to work with the distributed die codewords.

As shown in FIG. 5, the left portion of the odd numbered codewords and the right portions of the even numbered codewords (e.g., cw1L, cw3L, cw5L, cw7L, cw2R, cw4R, cw6R, and cw8R) may be stored in the first die 51. The right portions of the odd numbered codewords and the left portions of the even numbered codewords (e.g., cw1R, cw3R, cw5R, cw7R, cw2L, cw4L, cw6L, and cw8L) may be stored in the second die 52. In the event of a tile fail, the lost bits of the needed codewords do not participate in the same XOR equations. The XOR equation may have only one unknown and may be solved.

As shown in FIG. 5, for example, if Tile 4 of Die 1 fails, cw7L and cw8R may both be lost. To perform error recovery for the failed tile, the XOR equation for the left and right portions of the codeword may be represented as follows:

$$cw1L(1)+cw2L(1)+cw3L(1)+ \ldots +cw7L(1)+cw8L(1)=0 \quad [\text{Eq. 3}]$$

$$cw1R(1)+cw2R(1)+cw3R(1)+ \ldots +cw7R(1)+cw8R(1)=0 \quad [\text{Eq. 4}]$$

where the bit width of the XOR operation is the same as the bit width of the codeword. Because cw8L(1) is now known and only cw7L(1) is unknown, the equation for the left portion may be solved. For example, the value of cw7L(1) must be whatever bit value causes the equation to resolve to zero (0). Because cw7R(1) is now known and only cw8R(1) is unknown, the equation for the right portion may also be solved. For example, the value of cw8R(1) must be whatever bit value causes the equation to resolve to zero (0). Accordingly, in the event of a tile fail for Tile 4, the XOR operation will be able to recover the lost die contents because the XOR equation for the left portion of the codeword involves only erased bits from cw7, while the XOR equation for the right portion of the codeword involves only erased bits from cw8.

In another example, the media defect may correspond to the codeword size, the XOR operation may correspond to the codeword size, and the codeword may be distributed across k die. The codeword may be split into k equal portions, which may be represented as follows:

$$cwX=[cwX1 cwX2 cwX3 \ldots cwXk] \quad [\text{Eq. 5}]$$

where X corresponds to the codeword number and the number following X corresponds to the portion of the codeword. For example, for four die the codeword is divided into four portions (e.g., cw1=[cw11 cw12 cw13 cw14], where cw11 is the first portion of codeword one, cw12 is the second portion of codeword, etc.).

The XOR codeword may correspond to the XOR operation of all codewords within a stripe. The total codewords including the XOR codeword within a stripe may be a multiple of k, and may be distributed among the die based on the following:

$$cw11 \; cw22 \; cw33 \; \ldots \; cwkk \text{ go to die } 1$$

$$cw12 \; cw23 \; cw34 \; \ldots \; cwk1 \text{ go to die } 2$$

$$\ldots$$

$$cw1j \; cw2(j+1) \; \ldots \; cwk(j-1) \text{ go to die } j$$

$$cw1k \; cw2(k+1) \; \ldots \; cwk(k-1) \text{ go to die } k$$

where within a die, no same index of codewords overlap.

Figure 6:
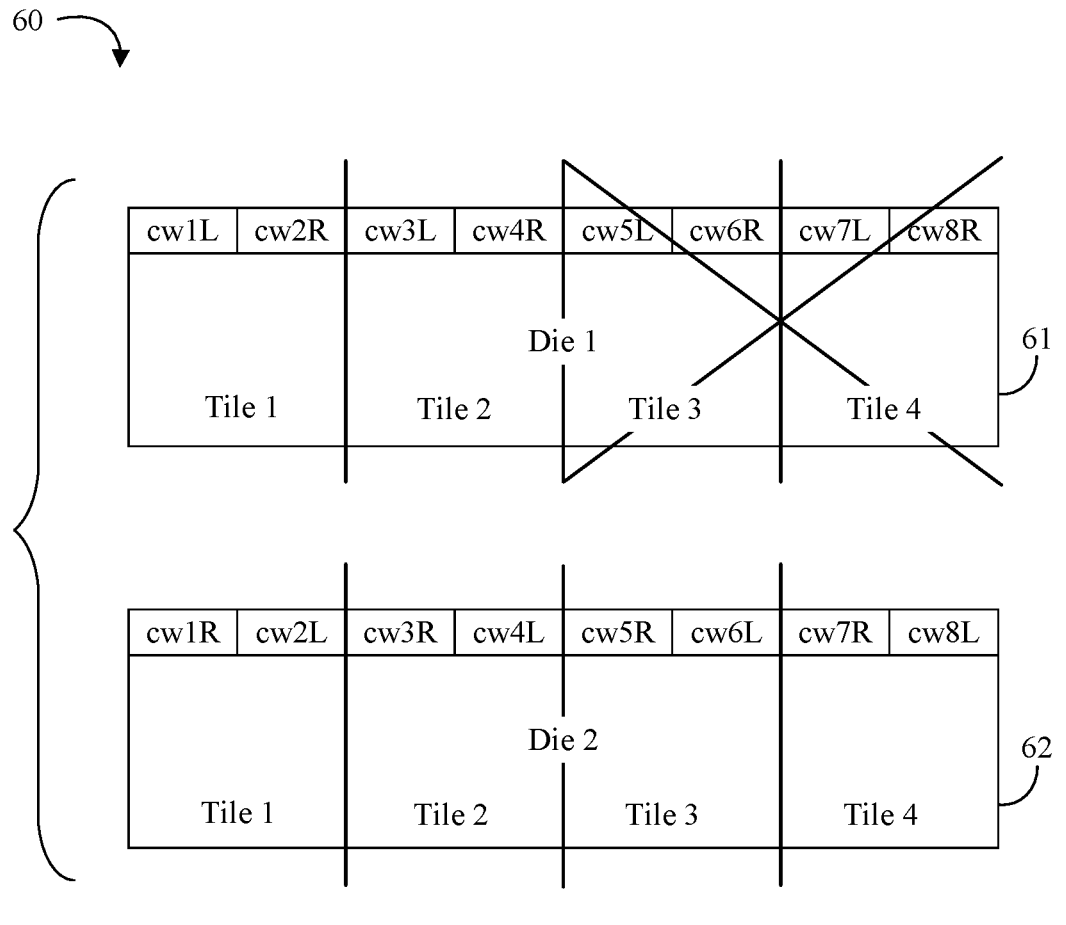
FIG. 6 is an illustrative diagram of another example of a memory system according to an embodiment.

Turning now to FIG. 6, an embodiment of a memory system 60 may include multiple die including a first die 61 and a second die 62. Each of the die may include multiple tiles (e.g., Tile 1 . . . Tile 4). The memory system 60 may further include error correction technology where the bit width of the XOR operation is larger than the bit width of the codeword. For example, in FIG. 6 the XOR operation may be 8K bits while the codeword size is 4K bits. When the XOR is larger than the codeword, some embodiments may create two or more groups corresponding to the number of codewords that fit into the size of one XOR operation (e.g., # of groups=8 KB XOR divided by 4 KB codeword=2 groups). Some embodiments may also divide the codewords into two or more portions corresponding to the number of die in the system 60. Other implementations may involve different organizations (e.g., an XOR with three codewords may utilize three groups, etc.)

Considering two tile fails for tiles 1,2 or tiles 3,4 (e.g., not two random tiles), then interleaving left and right portions in a die-distributed may not work. In the example of FIG. 6, some embodiments may divide the XOR on the odd labeled codewords and even labelled codewords separately. Advantageously, XOR done separately on these two groups will ensure recovery from two tile fails. If the defect corresponds to two tile fails as shown in FIG. 6, the ECC codeword is smaller than the defect size. Here, codewords may be grouped into as many groups as many codewords may be stored in the defect size. Two groups of codewords stored as shown in FIG. 6 may be separately XORed to recover from the two failed tiles. During reconstruction in the case of media defects, two or more codewords may be utilized for which the soft information may be generated from the XOR, and an LDPC decode may be performed.

In another example, the media defect may correspond to 2*codeword size, the XOR operation may correspond to 2*codeword size, and the codeword may be distributed across k die. The codeword may be split into k equal portions, which may be represented indicated above in Eq. 5 (e.g., cw1=[cw11 cw12 cw13 . . . cw1k]). Some embodiments may divide the stripe into two portions and separate XOR for the two portions, with one XOR with an odd index and the other XOR with an even index. Assuming k is even, the codewords distributed to die 1 may be represented as follows:

$$cw11 \; cw21 \; cw32 \; cw42 \; cw53 \; cw63 \; \ldots \; cw(k-1)(k/2) \; cwk(k/2)$$

$$\ldots$$

$$[cw1(k/2+1) \; cw2(k/2+1) \; cw3(k/2+2)$$

$$cw4(k/2+2) \; cw5(k/2+3) \; \ldots \; cw(k-1)k \; cwkk]$$

Advantageously, if these two codeword size blocks are erased, it is possible to reconstruct them because cw11 cw32 cw53 cw(k−1)(k/2) cw1($k$/2+1) cw(k−1)k may be erased and none of these have the bits with the same index. Similarly, reconstruction may be possible for the even codewords.

Figure 7:
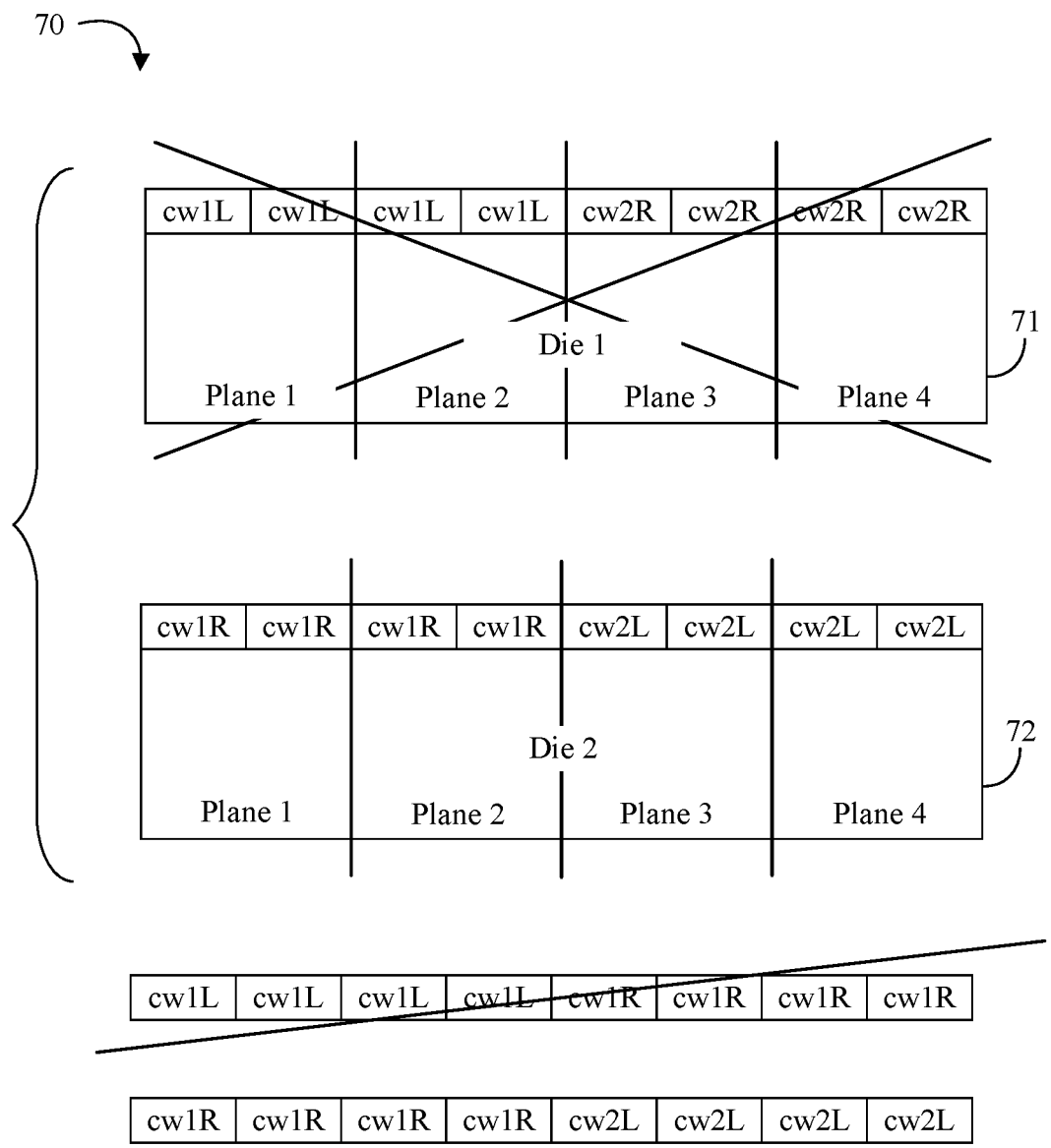
FIG. 7 is an illustrative diagram of another example of a memory system according to an embodiment.

Turning now to FIG. 7, an embodiment of a memory system 70 may include multiple die including a first die 71 and a second die 72. Each of the die may include multiple planes (e.g., Plane 1 . . . Plane 4). The memory system 70 may further include error correction technology where the bit width of the XOR operation is the same as the bit width of the codeword. For example, in FIG. 7 the XOR operation may be 64K bits and the codeword size is also 64K bits. During reconstruction in the case of media defects, two or more codewords may be utilized for which the soft information may be generated from the XOR, and an LDPC decode may be performed. A die fail may be covered with the 64 KB code (e.g., as described above). Those skilled in the art will appreciate that techniques discussed herein may be readily adapted to correct for plane fails (e.g., similar to the example of FIG. 6), or other media boundaries. For example, a plane fail may correspond to four tile fails that may be corrected with a corresponding four groups of codewords (e.g., instead of two groups for two tile fails).

Those skilled in the art will appreciate that the foregoing embodiments are only illustrative examples of die-distributed codeword technology that may be utilized with XOR error correction technology. Given the benefit of the present specification and drawings, numerous other techniques, schemes, and technology arrangements may occur to those skilled in the art to distribute first and second portions of multiple codes/groups corresponding to multiple tiles/planes of multiple die such that the XOR operation may be performed to successfully reconstruct the data for a failed tile/plane/die.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 8:
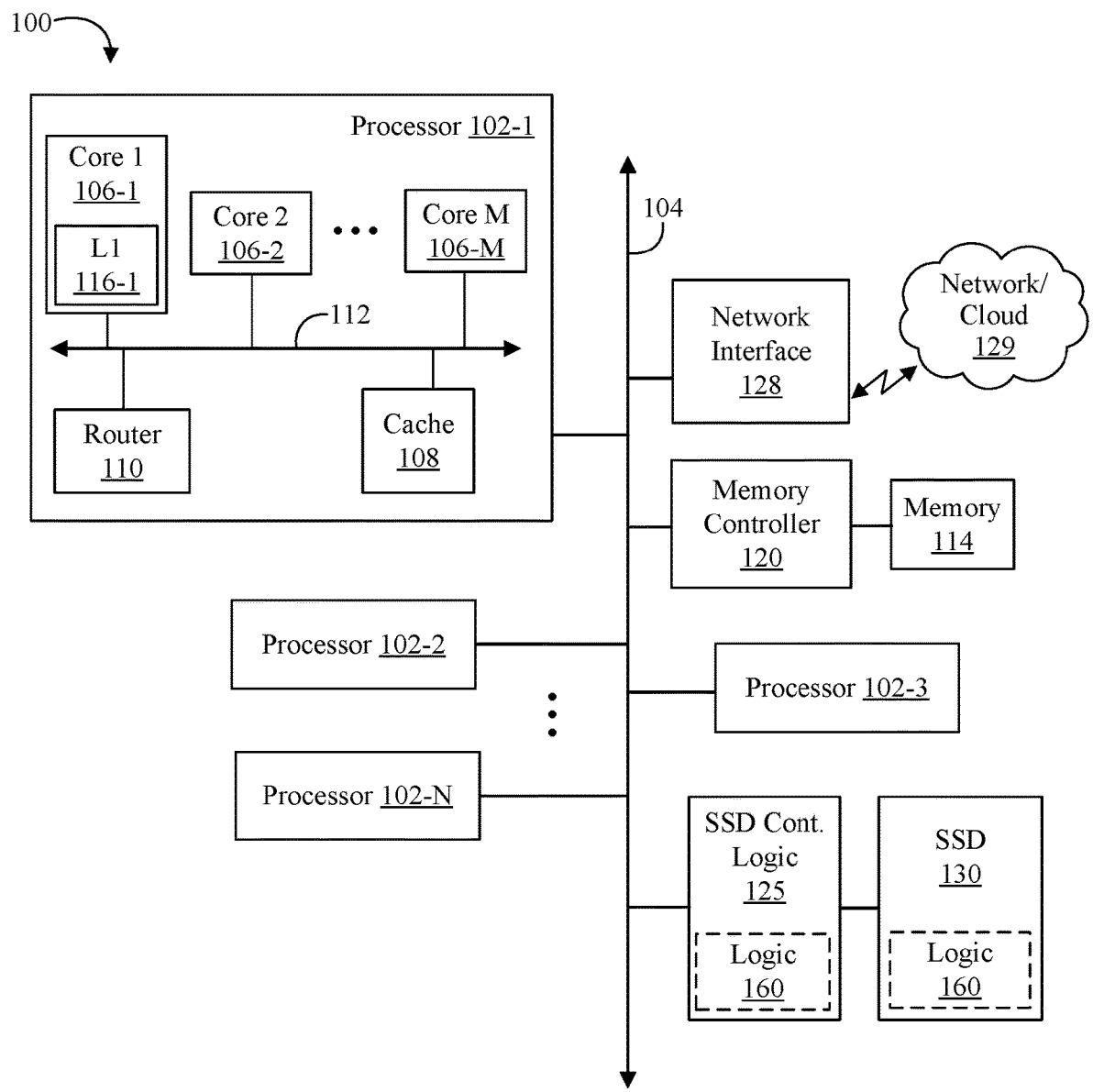
FIG. 8 is a block diagram of an example of a computing system according to an embodiment.

Turning now to FIG. 8, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 8, the memory 114 may be in communication with the processors 102 via the interconnection 104. In some embodiments, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 8, memory 114 may be coupled to other components of system 100 through a memory controller 120. Memory 114 may include volatile memory and may be interchangeably referred to as main memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include Non-Volatile (NV) storage device such as a SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 8, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), etc.) with one or more other components of system 100 (for example where the storage bus is coupled to interconnect 104 via some other logic like a bus bridge, chipset, etc. Additionally, logic 125 may be incorporated into memory controller logic (such as those discussed with reference to FIG. 9) or provided on a same integrated circuit (IC) device in various embodiments (e.g., on the same IC device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD 130, SSD bus, SATA bus, logic 125, logic 160, etc., to sense variations in various factors affecting power/thermal behavior of the system/platform, such as temperature, operating frequency, operating voltage, power consumption, and/or inter-core communication activity, etc.

As illustrated in FIG. 8, SSD 130 may include logic 160, which may be in the same enclosure as the SSD 130 and/or fully integrated on a printed circuit board (PCB) of the SSD 130. Advantageously, the logic 160 may include technology to implement one or more aspects of the method 25 (FIGS. 3A to 3C). For example, the logic 160 may include technology to store a first portion of a code for a tile in a first die of the SSD 130, store a second portion of the code for the tile in a second die of the SSD 130, and perform an XOR operation to correct a data error in the tile based on the stored first and second portions of the code. In some embodiments, the logic 160 may be configured to distribute first and second portions of multiple codes corresponding to multiple tiles of the first and second die such that the XOR operation may be performed to successfully reconstruct the data for a failed tile. For example, the logic 160 may be further configured to determine if the tile has failed, and perform the XOR operation to reconstruct the data for the tile based on only one of the first portion and the second portion of the code corresponding to the tile. In some embodiments, the logic 160 may be configured to store first portions of odd numbered codes and second portions of even numbered codes in the first die, and store second portions of odd numbered codes and first portions of even numbered codes in the second die (e.g., as described in more detail below). In some embodiments, a first bit width of the XOR operation may be wider than a second bit width of the code, and the logic 160 may be configured to perform the XOR operation to correct a data error in the two or more tiles based on two or mode codes, and distribute groups of the two or more codes corresponding to multiple tiles of the first and second die such that the XOR operation may be performed to successfully reconstruct the data for a failed tile.

In other embodiments, the SSD 130 may be replaced with any suitable persistent storage technology/media. In some embodiments, the logic 160 may be coupled to one or more substrates (e.g., silicon, sapphire, gallium arsenide, printed circuit board (PCB), etc.), and may include transistor channel regions that are positioned within the one or more substrates. As shown in FIG. 8, features or aspects of the logic 160 may be distributed throughout the SSD 130, and/or co-located/integrated with various components of the SSD 130.

Figure 9:
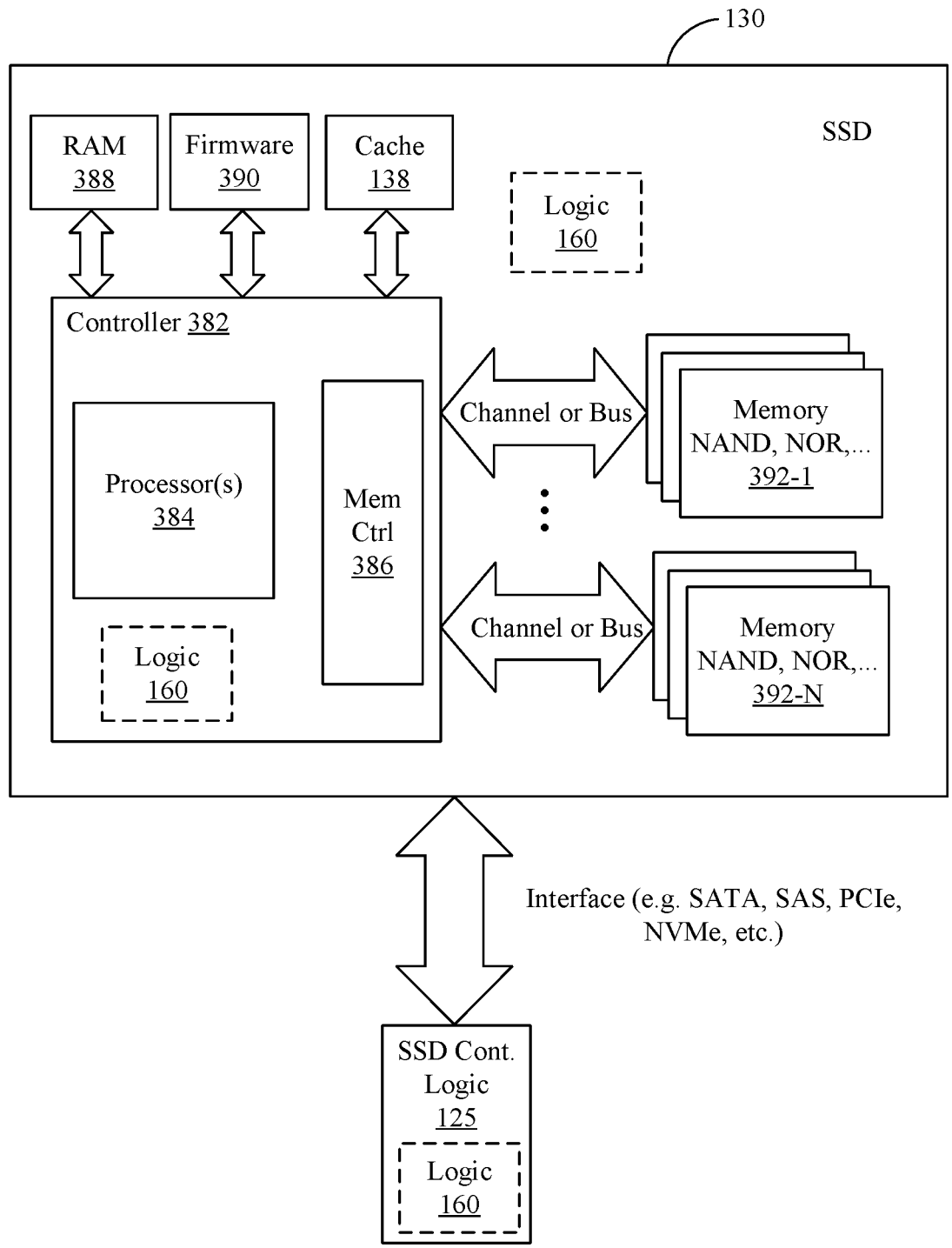
FIG. 9 is a block diagram of an example of a SSD according to an embodiment.

FIG. 9 illustrates a block diagram of various components of the SSD 130, according to an embodiment. As illustrated in FIG. 9, logic 160 may be located in various locations such as inside the SSD 130 or controller 382, etc., and may include similar technology as discussed in connection with FIG. 8. SSD 130 includes a controller 382 (which in turn includes one or more processor cores or processors 384 and memory controller logic 386), cache 138, RAM 388, firmware storage 390, and one or more memory modules or dies 392-1 to 392-N (which may include NAND flash, NOR flash, or other types of non-volatile memory). Memory modules 392-1 to 392-N are coupled to the memory controller logic 386 via one or more memory channels or busses. Also, SSD 130 communicates with logic 125 via an interface (such as a SATA, SAS, PCIe, NVMe, etc., interface). One or more of the features/aspects/operations discussed with reference to FIGS. 1-8 may be performed by one or more of the components of FIG. 9. Processors 384 and/or controller 382 may compress/decompress (or otherwise cause compression/decompression of) data written to or read from memory modules 392-1 to 392-N. Also, one or more of the features/aspects/operations of FIGS. 1-8 may be programmed into the firmware 390. Further, SSD controller logic 125 may also include logic 160.

ADDITIONAL NOTES AND EXAMPLES

Example 1 may include a semiconductor apparatus for use with two or more nonvolatile memory die with each die organized into two or more tiles, comprising one or more substrates, and logic coupled to the one or more substrates, wherein the logic is at least partly implemented in one or more of configurable logic and fixed-functionality hardware logic, the logic coupled to the one or more substrates to store a first portion of a code for a tile in a first die of the two or more nonvolatile memory die, store a second portion of the code for the tile in a second die of the two or more nonvolatile memory die, and perform an exclusive-or operation to correct a data error in the tile based on the stored first and second portions of the code.

Example 2 may include the apparatus of Example 1, wherein the logic is further to distribute first and second portions of multiple codes corresponding to multiple tiles of the first and second die such that the exclusive-or operation may be performed to successfully reconstruct the data for a failed tile.

Example 3 may include the apparatus of any of Examples 1 to 2, wherein the logic is further to determine if the tile has failed, and perform the exclusive-or operation to reconstruct the data for the tile based on only one of the first portion and the second portion of the code for the tile.

Example 4 may include the apparatus of any of Examples 1 to 3, wherein the logic is further to store first portions of odd numbered codes and second portions of even numbered codes in the first die, and store second portions of odd numbered codes and first portions of even numbered codes in the second die.

Example 5 may include the apparatus of Example 1, wherein a first bit width of the exclusive-or operation is wider than a second bit width of the code, wherein the logic is further to perform the exclusive-or operation to correct a data error in the two or more tiles based on two or mode codes, and distribute groups of the two or more codes corresponding to multiple tiles of the first and second die such that the exclusive-or operation may be performed to successfully reconstruct the data for a failed tile.

Example 6 may include the apparatus of any of Examples 1 to 5, wherein the two or more nonvolatile memory die comprise a solid state drive.

Example 7 may include the apparatus of any of Examples 1 to 6, wherein the logic coupled to the one or more substrates includes transistor channel regions that are positioned within the one or more substrates.

Example 8 may include an electronic storage system, comprising persistent storage media including two or more nonvolatile memory die with each die organized into two or more tiles, a controller communicatively coupled to the persistent storage media, and logic communicatively coupled to the controller to store a first portion of a code for a tile in a first die of the two or more nonvolatile memory die, store a second portion of the code for the tile in a second die of the two or more nonvolatile memory die, and perform an exclusive-or operation to correct a data error in the tile based on the stored first and second portions of the code.

Example 9 may include the system of Example 8, wherein the logic is further to distribute first and second portions of multiple codes corresponding to multiple tiles of the first and second die such that the exclusive-or operation may be performed to successfully reconstruct the data for a failed tile.

Example 10 may include the system of any of Examples 8 to 9, wherein the logic is further to determine if the tile has failed, and perform the exclusive-or operation to reconstruct the data for the tile based on only one of the first portion and the second portion of the code corresponding to the tile.

Example 11 may include the system of any of Examples 8 to 10, wherein the logic is further to store first portions of odd numbered codes and second portions of even numbered codes in the first die, and store second portions of odd numbered codes and first portions of even numbered codes in the second die.

Example 12 may include the system of Example 8, wherein a first bit width of the exclusive-or operation is wider than a second bit width of the code, wherein the logic is further to perform the exclusive-or operation to correct a data error in the two or more tiles based on two or mode codes, and distribute groups of the two or more codes corresponding to multiple tiles of the first and second die such that the exclusive-or operation may be performed to successfully reconstruct the data for a failed tile.

Example 13 may include the system of any of Examples 8 to 12, wherein the persistent storage media comprises a solid state drive.

Example 14 may include a method of controlling memory, comprising storing a first portion of a code for a tile in a first die of two or more nonvolatile memory die, storing a second portion of the code for the tile in a second die of the two or more nonvolatile memory die, and performing an exclusive-or operation to correct a data error in the tile based on the stored first and second portions of the code.

Example 15 may include the method of Example 14, further comprising distributing first and second portions of multiple codes corresponding to multiple tiles of the first and second die such that the exclusive-or operation may be performed to successfully reconstruct the data for a failed tile.

Example 16 may include the method of any of Examples 14 to 15, further comprising determining if the tile has failed, and performing the exclusive-or operation to reconstruct the data for the tile based on only one of the first portion and the second portion of the code corresponding to the tile.

Example 17 may include the method of any of Examples 14 to 16, further comprising storing first portions of odd numbered codes and second portions of even numbered codes in the first die, and storing second portions of odd numbered codes and first portions of even numbered codes in the second die.

Example 18 may include the method of Example 14, wherein a first bit width of the exclusive-or operation is wider than a second bit width of the code.

Example 19 may include the method of Example 18, further comprising performing the exclusive-or operation to correct a data error in the two or more tiles based on two or mode codes, and distributing groups of the two or more codes corresponding to multiple tiles of the first and second die such that the exclusive-or operation may be performed to successfully reconstruct the data for a failed tile.

Example 20 may include the method of any of Examples 14 to 19, wherein the two or more nonvolatile memory die comprise a solid state drive.

Example 21 may include at least one computer readable storage medium, comprising a set of instructions, which when executed by a computing device, cause the computing device to storing a first portion of a code for a tile in a first die of two or more nonvolatile memory die, storing a second portion of the code for the tile in a second die of the two or more nonvolatile memory die, and performing an exclusive-or operation to correct a data error in the tile based on the stored first and second portions of the code.

Example 22 may include the at least one computer readable storage medium of Example 21, comprising a further set of instructions, which when executed by the computing device, cause the computing device to distributing first and second portions of multiple codes corresponding to multiple tiles of the first and second die such that the exclusive-or operation may be performed to successfully reconstruct the data for a failed tile.

Example 23 may include the at least one computer readable storage medium of any of Examples 21 to 22, comprising a further set of instructions, which when executed by the computing device, cause the computing device to determining if the tile has failed, and performing the exclusive-or operation to reconstruct the data for the tile based on only one of the first portion and the second portion of the code corresponding to the tile.

Example 24 may include the at least one computer readable storage medium of any of Examples 21 to 23, comprising a further set of instructions, which when executed by the computing device, cause the computing device to storing first portions of odd numbered codes and second portions of even numbered codes in the first die, and storing second portions of odd numbered codes and first portions of even numbered codes in the second die.

Example 25 may include the at least one computer readable medium storage medium of Example 21, wherein a first bit width of the exclusive-or operation is wider than a second bit width of the code.

Example 26 may include the at least one computer readable storage medium of Example 25, comprising a further set of instructions, which when executed by the computing device, cause the computing device to performing the exclusive-or operation to correct a data error in the two or more tiles based on two or mode codes, and distributing groups of the two or more codes corresponding to multiple tiles of the first and second die such that the exclusive-or operation may be performed to successfully reconstruct the data for a failed tile.

Example 27 may include the at least one computer readable medium storage medium of any of Examples 21 to 26, wherein the two or more nonvolatile memory die comprise a solid state drive.

Example 28 may include a memory controller apparatus, comprising means for storing a first portion of a code for a tile in a first die of two or more nonvolatile memory die, means for storing a second portion of the code for the tile in a second die of the two or more nonvolatile memory die, and means for performing an exclusive-or operation to correct a data error in the tile based on the stored first and second portions of the code.

Example 29 may include the apparatus of Example 28, further comprising means for distributing first and second portions of multiple codes corresponding to multiple tiles of the first and second die such that the exclusive-or operation may be performed to successfully reconstruct the data for a failed tile.

Example 30 may include the apparatus of any of Examples 28 to 29, further comprising means for determining if the tile has failed, and means for performing the exclusive-or operation to reconstruct the data for the tile based on only one of the first portion and the second portion of the code corresponding to the tile.

Example 31 may include the apparatus of any of Examples 28 to 30, further comprising means for storing first portions of odd numbered codes and second portions of even numbered codes in the first die, and means for storing second portions of odd numbered codes and first portions of even numbered codes in the second die.

Example 32 may include the apparatus of Example 28, wherein a first bit width of the exclusive-or operation is wider than a second bit width of the code.

Example 33 may include the apparatus of Example 32, further comprising means for performing the exclusive-or operation to correct a data error in the two or more tiles based on two or mode codes, and means for distributing groups of the two or more codes corresponding to multiple tiles of the first and second die such that the exclusive-or operation may be performed to successfully reconstruct the data for a failed tile.

Example 34 may include the apparatus of any of Examples 28 to 33, wherein the two or more nonvolatile memory die comprise a solid state drive.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus for use with two or more nonvolatile memory die with each die organized into two or more tiles, comprising:
   one or more substrates; and
   logic coupled to the one or more substrates, wherein the logic is at least partly implemented in one or more of configurable logic and fixed-functionality hardware logic, the logic coupled to the one or more substrates to:
      store a first portion of a code for a tile in a first die of the two or more nonvolatile memory die,
      store a second portion of the code for the tile in a second die of the two or more nonvolatile memory die, and
      perform an exclusive-or operation to correct a data error in the tile based on the stored first and second portions of the code.

2. The apparatus of claim 1, wherein the logic is further to:
   distribute first and second portions of multiple codes corresponding to multiple tiles of the first and second die such that the exclusive-or operation may be performed to successfully reconstruct the data for a failed tile.

3. The apparatus of claim 2, wherein the logic is further to:
   determine if the tile has failed; and
   perform the exclusive-or operation to reconstruct the data for the tile based on only one of the first portion and the second portion of the code for the tile.

4. The apparatus of claim 2, wherein the logic is further to:
   store first portions of odd numbered codes and second portions of even numbered codes in the first die; and
   store second portions of odd numbered codes and first portions of even numbered codes in the second die.

5. The apparatus of claim 1, wherein a first bit width of the exclusive-or operation is wider than a second bit width of the code, wherein the logic is further to:
   perform the exclusive-or operation to correct a data error in the two or more tiles based on two or mode codes; and
   distribute groups of the two or more codes corresponding to multiple tiles of the first and second die such that the exclusive-or operation may be performed to successfully reconstruct the data for a failed tile.

6. The apparatus of claim 1, wherein the two or more nonvolatile memory die comprise a solid state drive.

7. The apparatus of claim 1, wherein the logic coupled to the one or more substrates includes transistor channel regions that are positioned within the one or more substrates.

8. An electronic storage system, comprising:
persistent storage media including two or more nonvolatile memory die with each die organized into two or more tiles;
a controller communicatively coupled to the persistent storage media; and
logic communicatively coupled to the controller to:
store a first portion of a code for a tile in a first die of the two or more nonvolatile memory die,
store a second portion of the code for the tile in a second die of the two or more nonvolatile memory die, and
perform an exclusive-or operation to correct a data error in the tile based on the stored first and second portions of the code.

9. The system of claim 8, wherein the logic is further to:
distribute first and second portions of multiple codes corresponding to multiple tiles of the first and second die such that the exclusive-or operation may be performed to successfully reconstruct the data for a failed tile.

10. The system of claim 9, wherein the logic is further to:
determine if the tile has failed; and
perform the exclusive-or operation to reconstruct the data for the tile based on only one of the first portion and the second portion of the code corresponding to the tile.

11. The system of claim 10, wherein the logic is further to:
store first portions of odd numbered codes and second portions of even numbered codes in the first die; and
store second portions of odd numbered codes and first portions of even numbered codes in the second die.

12. The system of claim 8, wherein a first bit width of the exclusive-or operation is wider than a second bit width of the code, wherein the logic is further to:
perform the exclusive-or operation to correct a data error in the two or more tiles based on two or mode codes; and
distribute groups of the two or more codes corresponding to multiple tiles of the first and second die such that the exclusive-or operation may be performed to successfully reconstruct the data for a failed tile.

13. The system of claim 8, wherein the persistent storage media comprises a solid state drive.

14. A method of controlling memory, comprising:
storing, via a controller, a first portion of a code for a tile in a first die of two or more nonvolatile memory die;
storing, via the controller, a second portion of the code for the tile in a second die of the two or more nonvolatile memory die; and
performing, via the controller, an exclusive-or operation to correct a data error in the tile based on the stored first and second portions of the code.

15. The method of claim 14, further comprising:
distributing first and second portions of multiple codes corresponding to multiple tiles of the first and second die such that the exclusive-or operation may be performed to successfully reconstruct the data for a failed tile.

16. The method of claim 15, further comprising:
determining if the tile has failed; and
performing the exclusive-or operation to reconstruct the data for the tile based on only one of the first portion and the second portion of the code corresponding to the tile.

17. The method of claim 16, further comprising:
storing first portions of odd numbered codes and second portions of even numbered codes in the first die; and
storing second portions of odd numbered codes and first portions of even numbered codes in the second die.

18. The method of claim 14, wherein a first bit width of the exclusive-or operation is wider than a second bit width of the code.

19. The method of claim 18, further comprising:
performing the exclusive-or operation to correct a data error in the two or more tiles based on two or mode codes; and
distributing groups of the two or more codes corresponding to multiple tiles of the first and second die such that the exclusive-or operation may be performed to successfully reconstruct the data for a failed tile.

20. The method of claim 14, wherein the two or more nonvolatile memory die comprise a solid state drive.

* * * * *